(12) United States Patent
Jin et al.

(10) Patent No.: US 11,348,820 B2
(45) Date of Patent: May 31, 2022

(54) INSTALLATION FIXTURE FOR ELECTRODE PLATE OF SEMICONDUCTOR EQUIPMENT

(71) Applicant: CHANGXIN MEMORY TECHNOLOGIES, INC., Hefei (CN)

(72) Inventors: Jiangyi Jin, Hefei (CN); Jungsu Kang, Hefei (CN)

(73) Assignee: CHANGXIN MEMORY TECHNOLOGIES, INC., Anhui (CN)

(*) Notice: Subject to any disclaimer, the term of this patent is extended or adjusted under 35 U.S.C. 154(b) by 0 days.

(21) Appl. No.: 17/648,205

(22) Filed: Jan. 18, 2022

(65) Prior Publication Data
US 2022/0139753 A1 May 5, 2022

Related U.S. Application Data

(63) Continuation of application No. PCT/CN2021/112597, filed on Aug. 13, 2021.

(30) Foreign Application Priority Data
Sep. 29, 2020 (CN) .......................... 202011047330.8

(51) Int. Cl.
*H01T 23/00* (2006.01)
*H01L 21/683* (2006.01)
*H01L 21/67* (2006.01)

(52) U.S. Cl.
CPC .... *H01L 21/6833* (2013.01); *H01L 21/67063* (2013.01)

(58) Field of Classification Search
None
See application file for complete search history.

(56) References Cited

U.S. PATENT DOCUMENTS 6,831,307 B2 * 12/2004 Fujii ................. H01L 21/68757
                                                          438/692
7,661,386 B2 *  2/2010 Kasai ................. C23C 16/45572
                                                          118/723 R
(Continued)

FOREIGN PATENT DOCUMENTS

CN          101034679 A       9/2007
CN          102280339 A      12/2011
(Continued)

OTHER PUBLICATIONS

International Search Report and English Translation cited in PCT/CN2021/112597 dated Nov. 15, 2021, 11 pages.
(Continued)

*Primary Examiner* — Stephen W Jackson
(74) *Attorney, Agent, or Firm* — Cooper Legal Group, LLC

(57) ABSTRACT

The present disclosure relates to an installation fixture for an electrode plate of a semiconductor equipment. The installation fixture includes: an alignment assembly, including a support disc and at least two guide shafts, where the support disc is provided with at least two positioning holes, at least two fixing holes and at least two mounting holes; a drive assembly, including a mounting plate assembly, at least two support rods and a drive rod assembly, where the support rods are connected to the mounting plate assembly, and one end of each of the support rods is connected to one of the mounting holes; and the drive rod assembly is connected to the mounting plate assembly; and a support assembly, including at least two support bases, where each of the support bases is provided with a mounting groove.

10 Claims, 10 Drawing Sheets

(56) References Cited

U.S. PATENT DOCUMENTS

| | | | |
|---|---|---|---|
| 9,117,857 | B2 | 8/2015 | Kobayashi |
| 9,837,295 | B2 * | 12/2017 | Johnson ............ H01L 21/67092 |
| 2004/0244949 | A1 | 12/2004 | Fink |
| 2007/0211402 | A1 | 9/2007 | Sawataishi et al. |
| 2011/0303643 | A1 | 12/2011 | Wada et al. |

FOREIGN PATENT DOCUMENTS

| | | |
|---|---|---|
| CN | 102738041 A | 10/2012 |
| CN | 206312872 U | 7/2017 |

OTHER PUBLICATIONS

Written Opinion and English Translation cited in PCT/CN2021/112597 dated Nov. 15, 2021,7 pages.

* cited by examiner

INSTALLATION FIXTURE FOR ELECTRODE PLATE OF SEMICONDUCTOR EQUIPMENT

CROSS-REFERENCE TO RELATED APPLICATIONS

This is a continuation of International Patent Application No. PCT/CN2021/112597, filed on Aug. 13, 2021, which claims the priority to Chinese Patent Application No. 202011047330.8, titled "INSTALLATION FIXTURE FOR ELECTRODE PLATE OF SEMICONDUCTOR EQUIPMENT" and filed on Sep. 29, 2020. The entire contents of International Patent Application No. PCT/CN2021/112597 and Chinese Patent Application No. 202011047330.8 are incorporated herein by reference.

TECHNICAL FIELD

The present disclosure relates to the technical field of semiconductor manufacturing, in particular to an installation fixture for an electrode plate of a semiconductor equipment.

BACKGROUND

At present, in the technical field of semiconductors, the disassembly and assembly of an electrode plate of a semiconductor equipment usually requires at least two operators to complete, which wastes a lot of human resources. Meanwhile, during the mounting of the electrode plate, the operators are also required to manually align screws on the fixing disc with screw holes on the electrode plate. It is likely to cause the position of the lip seal ring on the fixing disc to deviate, thereby leading to leakage inside the cavity and ultimately affecting the etching of the semiconductor. In addition, the manual mounting by the operators is prone to bumps, which will cause damage to the electrode plate, thereby increasing the mounting cost of the electrode plate.

It should be noted that the information disclosed above is merely intended to facilitate a better understanding of the background of the present disclosure, and therefore may include information that does not constitute the prior art known to those of ordinary skill in the art.

SUMMARY

The present disclosure provides an installation fixture for an electrode plate of a semiconductor equipment.

An aspect of the present disclosure provides an installation fixture for an electrode plate of a semiconductor equipment. The semiconductor equipment is provided with a fixing disc; the fixing disc is provided with at least two positioning screws and at least two fixing screws; the electrode plate is provided with at least two positioning screw holes and at least two fixing screw holes; and the installation fixture for an electrode plate of a semiconductor equipment includes:

an alignment assembly, including a support disc and at least two guide shafts, where the support disc is provided with at least two positioning holes, at least two fixing holes and at least two mounting holes; the guide shafts are able to pass through the positioning holes and the positioning screw holes; one end of each of the guide shafts is provided with a positioning groove, and the positioning groove is able to be connected to one of the positioning screws; and the fixing screws are able to pass through the fixing screw holes and the fixing holes;

a drive assembly, including a mounting plate assembly, at least two support rods and a drive rod assembly, where the support rods are connected to the mounting plate assembly, and one end of each of the support rods is connected to one of the mounting holes; and the drive rod assembly is connected to the mounting plate assembly; and a support assembly, including at least two support bases, where each of the support bases is provided with a mounting groove; and the other end of each of the support rods is located in the mounting groove.

It should be understood that the above general description and the following detailed description are only exemplary and explanatory, and should not be construed as a limitation to the present disclosure.

BRIEF DESCRIPTION OF THE DRAWINGS

The drawings incorporated into the specification and constituting part of the specification illustrate the embodiments of the present disclosure, and serve, together with the specification, to explain the principles of the present disclosure. Apparently, the drawings in the following description show merely some embodiments of the present disclosure, and those of ordinary skill in the art may still derive other drawings from these drawings without creative efforts.

DETAILED DESCRIPTION

Figure 1:
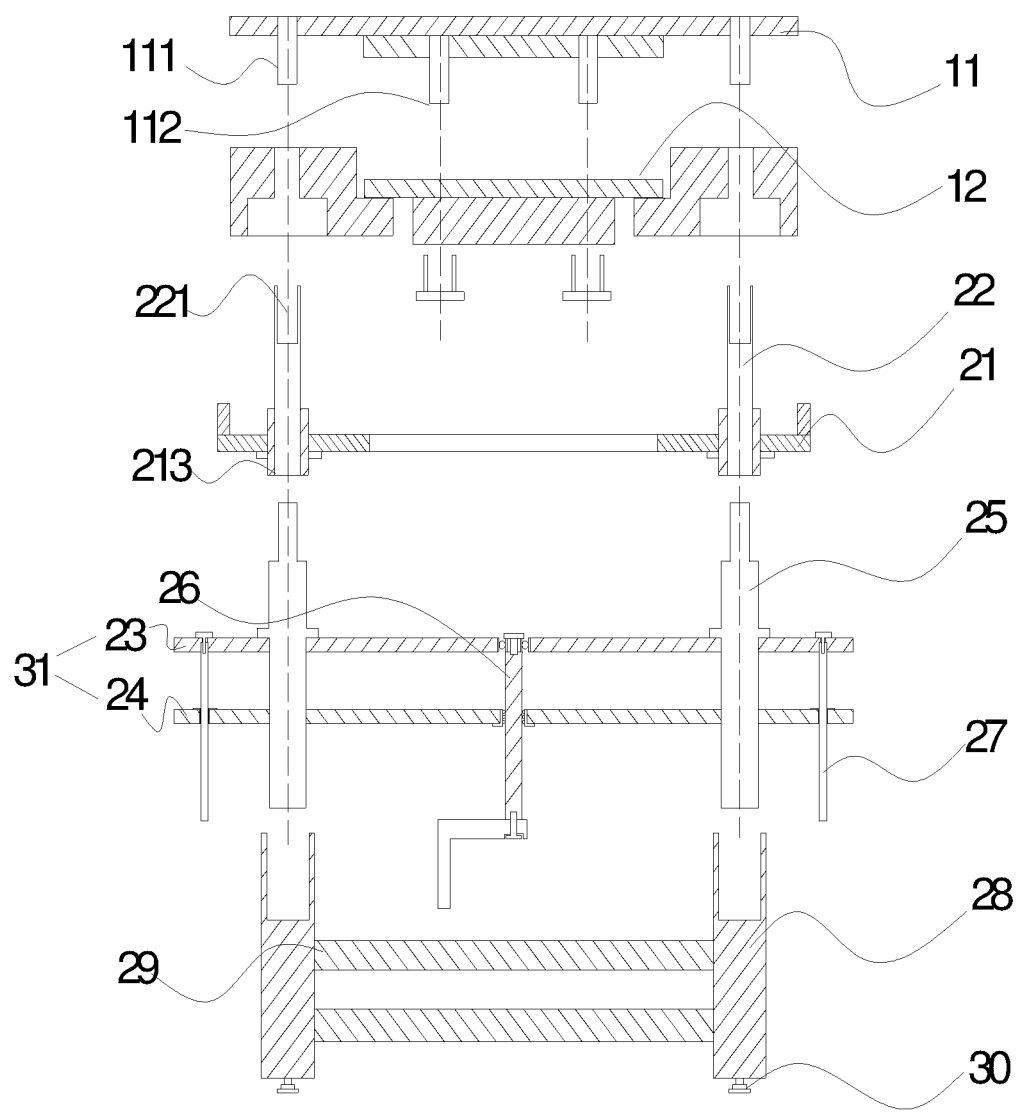
FIG. 1 is a view illustrating a structure of an installation fixture for an electrode plate of a semiconductor equipment according to an exemplary embodiment of the present disclosure.

The exemplary embodiments are described more comprehensively below with reference to the drawings. The exemplary implementations may be implemented in various forms, and may not be construed as being limited to those described herein. On the contrary, these exemplary implementations are provided to make the present disclosure comprehensive and complete and to fully convey the concept manifested therein to those skilled in the art. The same reference numerals in the figures indicate the same or similar structures, and thus their detailed descriptions will be omitted.

The terms "a", "an", "the", and "said" are used to indicate that there are one or more elements/components/etc. The terms "including" and "having" are used to mean open-ended inclusion and mean that there may be additional elements/components/etc. in addition to the listed elements/components/etc.

Figure 2:
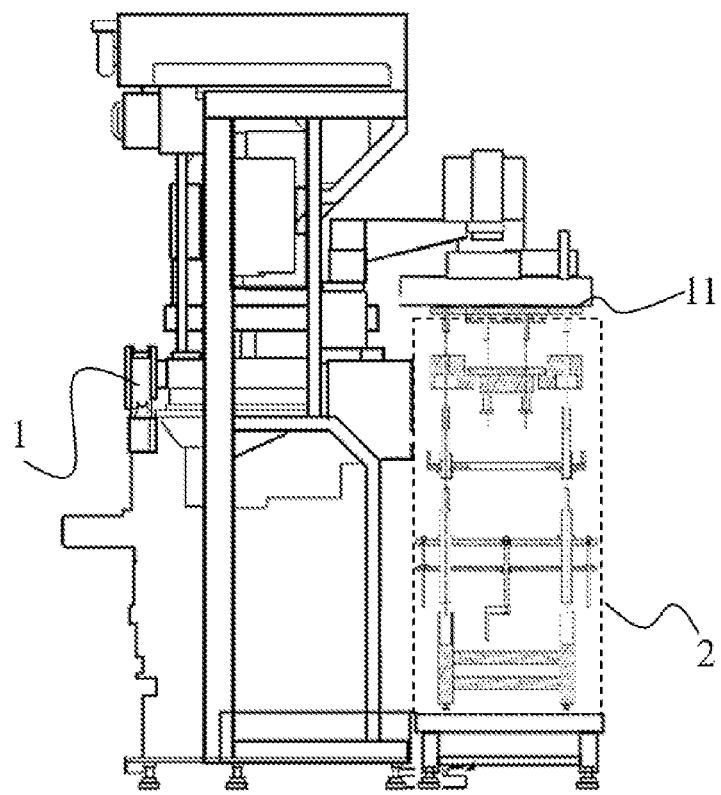
FIG. 2 is a view illustrating a structure of the installation fixture for an electrode plate of a semiconductor equipment at the beginning of work according to an exemplary embodiment of the present disclosure.
Figure 3:
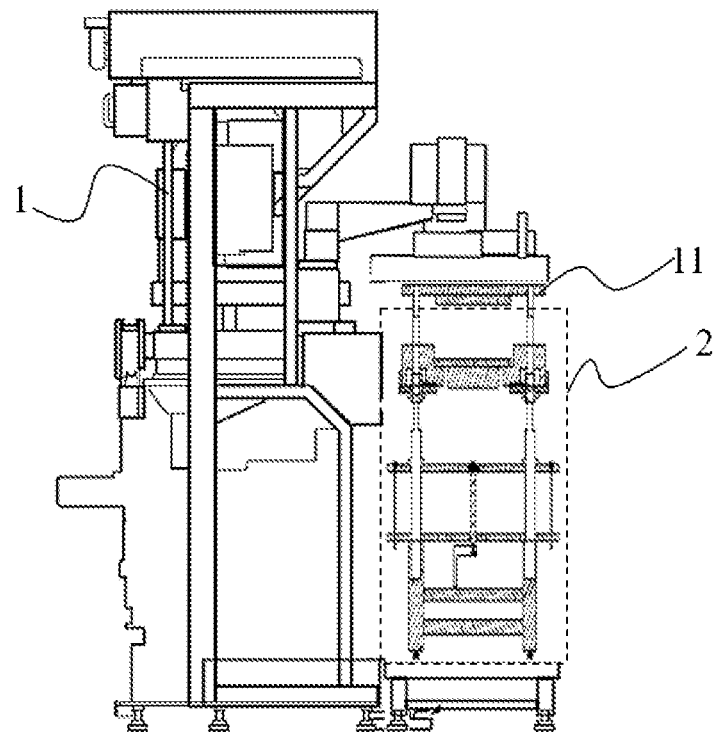
FIG. 3 is a view illustrating a structure of the installation fixture for an electrode plate of a semiconductor equipment at the end of work according to an exemplary embodiment of the present disclosure.

As shown in FIGS. 1 to 3, the present disclosure provides an installation fixture 2 for an electrode plate of a semiconductor equipment. The installation fixture 2 may include an alignment assembly, a drive assembly and a support assembly. The installation fixture 2 can realize the purpose of mounting an electrode plate 12 by a single person, thereby saving a lot of manpower resources and improving the mounting efficiency. Meanwhile, the installation fixture 2 of the present disclosure can also automatically align to prevent the impact on semiconductor etching due to the inaccurate alignment of the electrode plate 12. In addition, the installation fixture can also prevent damage to the electrode plate 12 due to a bump during manual mounting by an operator, thereby reducing the mounting cost of the electrode plate 12.

Further, as shown in FIGS. 2 and 3, the above-mentioned semiconductor equipment 1 may be provided with a fixing disc 11. The fixing disc 11 is used to mount the electrode plate 12. The fixing disc 11 may be provided with at least two positioning screws 111 and at least two fixing screws 112. It should be noted that the positioning screws 111 and the fixing screws 112 may be the same or different screws. Meanwhile, multiple lip seals may also be provided on the fixing disc 11 to seal and divide regions define by the fixing disc 11 and the electrode plate 12 so as to prevent leakage and mutual influence between different regions.

Figure 4:
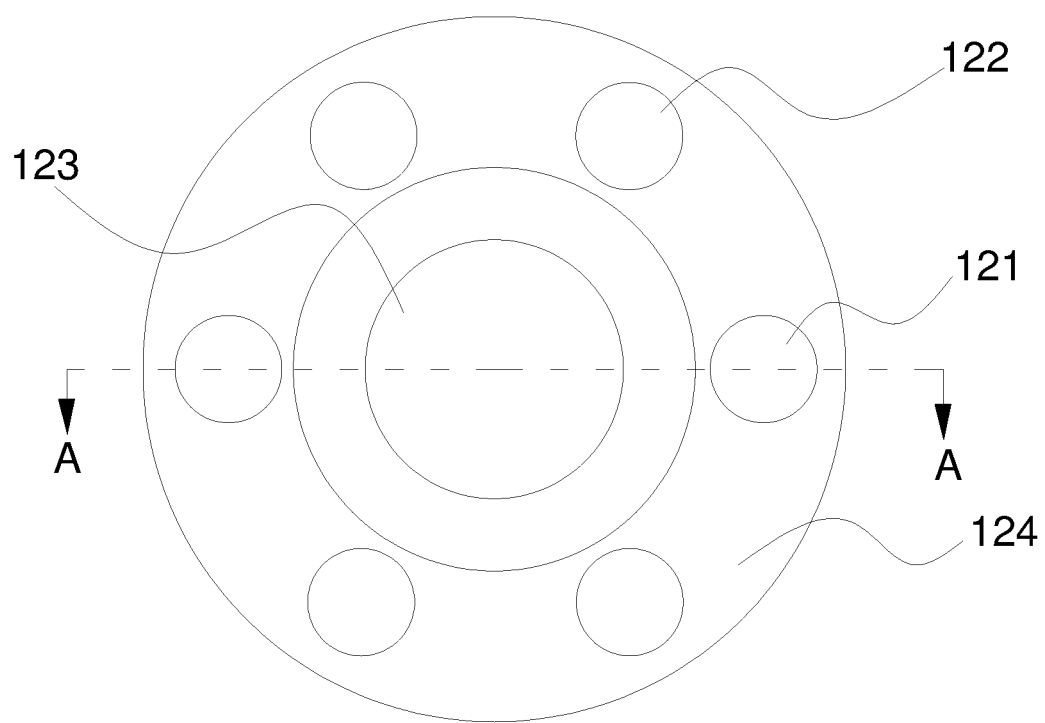
FIG. 4 is a view illustrating a structure of the electrode plate according to an exemplary embodiment of the present disclosure.
Figure 5:
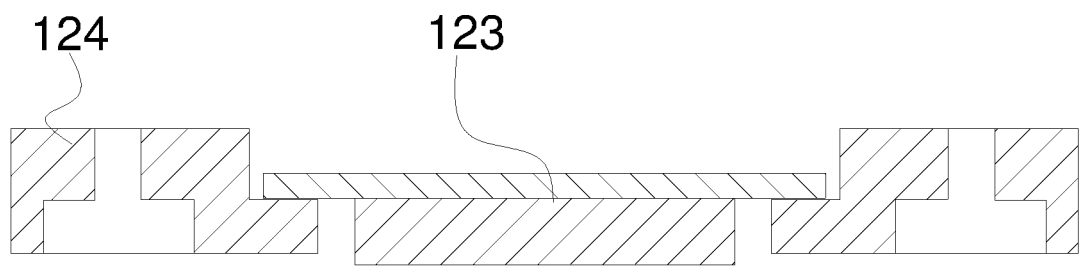
FIG. 5 is a sectional view illustrating a structure taken along line A-A in FIG. 4 according to an exemplary embodiment of the present disclosure.
Figure 6:
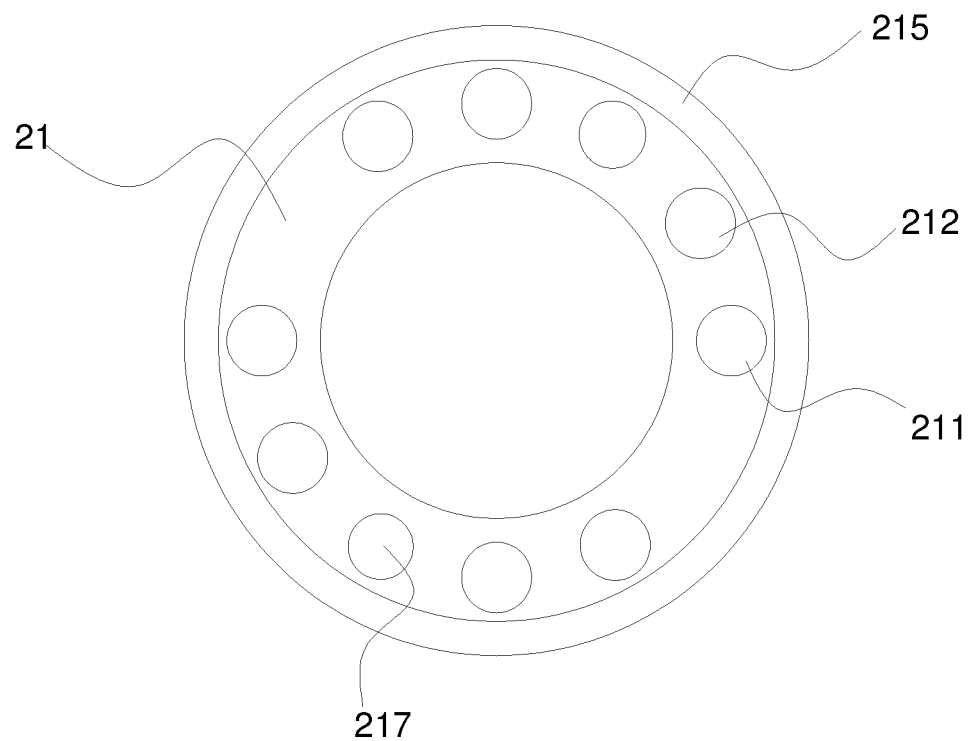
FIG. 6 is a view illustrating a structure of a support disc according to an exemplary embodiment of the present disclosure.

As shown in FIGS. 4 and 5, the electrode plate 12 may be provided with at least two positioning screw holes 121 and at least two fixing screw holes 122. The positioning screw holes 121 are matched with the positioning screws 111, and the fixing screw holes 122 are matched with the fixing screws 112. That is, the positioning screw holes 121 of the electrode plate 12 are connected to the positioning screws 111 of the fixing disc 11, so as to realize the positioning and connection of the electrode plate 12. The fixing screw holes 122 of the electrode plate 12 are connected to the fixing screws 112 of the fixing disc 11, so as to realize the connection and fixing of the electrode plate 12 to the fixing disc 11. It should be noted that the positioning screw holes 121 and the fixing screw holes 122 may be the same or different, which falls within the protection scope of the present disclosure.

Further, the electrode plate 12 may include an electrode 123 and a clamping ring 124. The electrode 123 may be mounted on the clamping ring 124, that is, the clamping ring 124 may be enclosed outside the electrode 123. For example, the electrode 123 and the clamping ring 124 may be integrally formed to define the electrode plate 12, but it is not limited thereto. The electrode 123 and the clamping ring 124 may also be manufactured separately. After the manufacturing of the electrode 123 and the clamping ring 124 is completed, they are connected together to form the electrode plate 12.

In an embodiment of the present disclosure, as shown in FIGS. 1 and 6 to 11, the alignment assembly may include a support disc 21 and at least two guide shafts 22. The support disc 21 may be provided with at least two positioning holes 211, at least two fixing holes 217 and at least two mounting holes 212. The positioning holes 211 may be aligned with the positioning screws 111 on the fixing disc 11, the fixing holes 217 may be aligned with the fixing screws 112 on the fixing disc 11, and the fixing screws 112 may pass through the fixing screw holes 122 and the fixing holes 217. After the electrode plate 12 is placed on the support disc 21, the positioning screw holes 121 and the fixing screw holes 122 on the electrode plate 12 are aligned with the positioning holes 211 and the fixing holes 217 on the support disc, respectively. Only by doing so, the positioning screw holes 121 are aligned with the positioning screws 111, and the fixing screw hole 122 are aligned with the fixing screws 112.

It should be noted that the number of the positioning holes 211 on the support disc 21 may be the same as that of the positioning screw holes 121 and that of the positioning screws 111. The number of the fixing holes 217 on the support disc 21 may be the same as that of the fixing screw holes 122 and that of the fixing screws 112. The diameter of the positioning holes 211 on the support disc 21 may be the same as that of the positioning screw holes 121.

The guide shafts 22 are able to pass through the positioning holes 211 and the positioning screw holes 121. One end of each of the guide shafts 22 may be provided with a positioning groove 221, and the positioning groove 221 is able to be connected to one of the positioning screws 111. Thus, the guide shafts 22 are able to be connected to the positioning screws 111 through positioning groove 221. The present disclosure does not limit the connection manner of the positioning grooves 221 and the positioning screws 111. For example, the positioning grooves 221 and the positioning screws 111 may be fixedly connected, or may be detachably connected. When the positioning grooves 221 are detachably connected to the positioning screws 111, the guide shafts 22 may be removed after the electrode plate 12 and the fixing disc 11 are aligned, so as to prevent the guide shafts 22 from affecting the operation of the semiconductor equipment. Meanwhile, after the guide shafts 22 are removed, the electrode plate 12 and the fixing disc may still be fixed by the positioning screws 111 and the positioning screw holes 121. That is, the positioning screws 111 and the positioning screw holes 121 function as the fixing screws 112 and the fixing screw holes 122, thereby making the fixing of the electrode plate 12 more stable and minimizing the number of the fixing screws 112 and the fixing screw holes 122.

Further, after the guide shafts 22 pass through the positioning screw holes 121 and the positioning holes 211, the electrode plate 12 may be further positioned. Thus, when the electrode plate 12 and the fixing disc 11 are finally fixed, the electrode plate 12 is prevented from deviating, so as to avoid the failure of the mounting of the electrode plate 12. It should be noted that the number of the guide shafts 22 may be the same as that of the positioning screws 111. The length of the guide shafts 22 may be greater than or equal to the total thickness of the electrode plate 12 and the fixing disc 11, and the diameter of the guide shafts 22 may be less than or equal to that of the positioning holes 211 and the positioning screw holes 121.

Preferably, the diameter of the guide shafts 22 may be slightly less than that of the positioning holes 211 and the positioning screw holes 121, such that the guide shafts 22 are transitionally fitted to the positioning holes 211 and the positioning screw holes 121. In this way, the electrode plate 12 is better positioned, ensuring that the alignment of the electrode plate 12 and the fixing disc 11 is more accurate.

As shown in FIGS. 12 to 17, the drive assembly may include a mounting plate assembly 31, at least two support rods 25 and a drive rod assembly 26. The support rods 25 may be connected to the mounting plate assembly 31, and one end of each of the support rods 25 may be connected to one of the mounting holes 212. It is understandable that connecting the support rods 25 to the mounting plate assembly 31 may enable the support rods 25 to move with the movement of the mounting plate assembly 31. One end of each of the support rods 25 may be fixedly connected to one of the mounting holes 212, or may be transitionally matched with one of the mounting holes 212, such that the support rods 25 drive the support disc 21 to move. However, the present disclosure does not limit the connection manner between one end of each of the support rods 25 and one of the mounting hole 212, as long as the support rods 25 can drive the support disc 21 to move, which falls within the protection scope of the present disclosure. In addition, the number of the support rods 25 may be the same as that of the mounting holes 212 or different from that of the mounting holes 212, which falls within the protection scope of the present disclosure.

The drive rod assembly 26 may also be connected to the mounting plate assembly 31 to drive the mounting plate assembly 31 to move and then to drive the support disc 21 to move, such that the electrode plate 12 on the support disc 21 moves toward the fixing disc 11.

Figure 18:
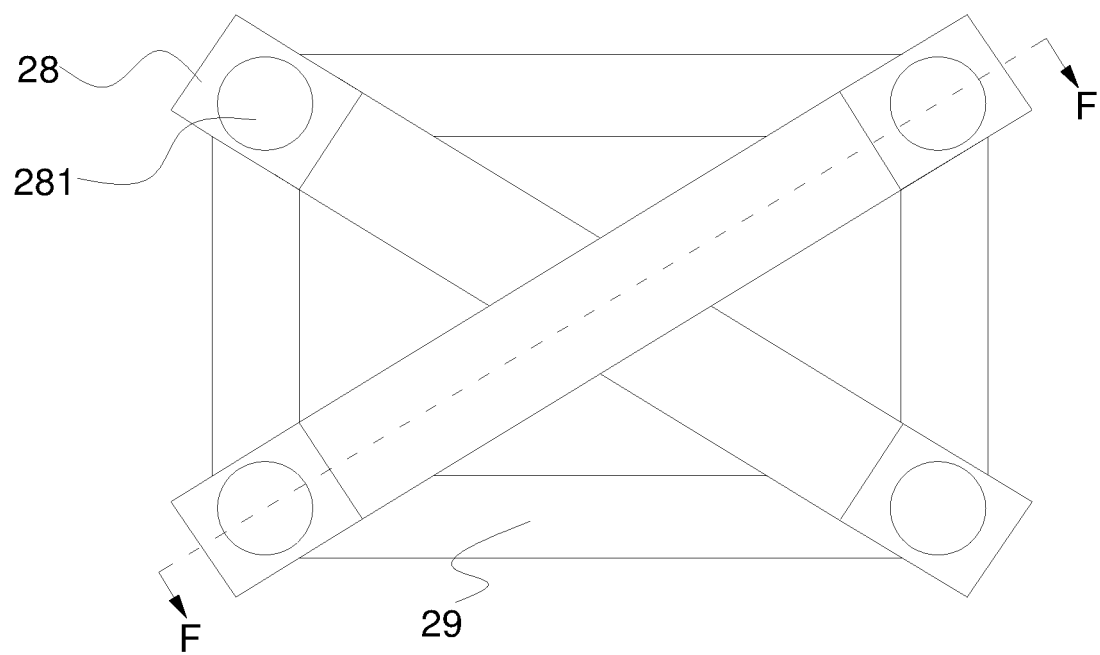
FIG. 18 is a top view illustrating the support assembly according to an exemplary embodiment of the present disclosure.
Figure 19:
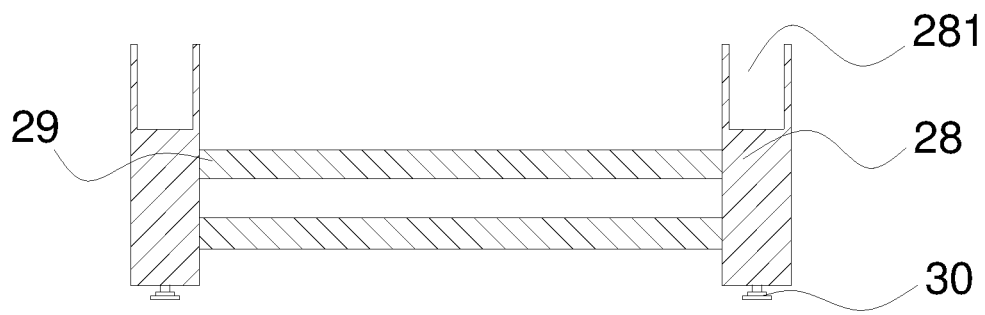
FIG. 19 is a sectional view illustrating a structure taken along line F-F in FIG. 18 according to an exemplary embodiment of the present disclosure.
Figure 20:
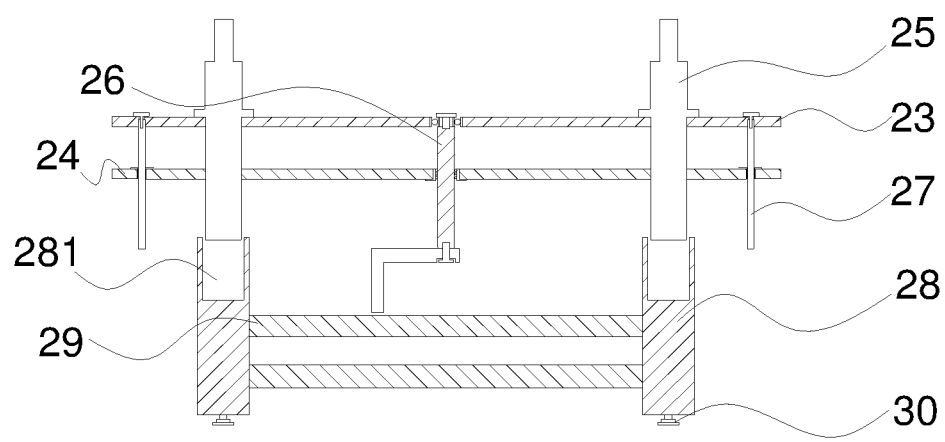
FIG. 20 is a view illustrating a structure of the drive assembly and the support assembly that are connected according to an exemplary embodiment of the present disclosure.

As shown in FIGS. 18 to 20, the support assembly may include at least two support bases 28. The support bases 28 each may be provided with a mounting groove 281, and the other end of each of the support rods 25 may be located in the mounting groove 281. It is understandable that an end of each of the support bases 28 close to the mounting plate assembly 31 may be provided with one mounting groove 281, and may be connected to the other end of each of the support rods 25 through the mounting groove 281. It should be noted that when the drive assembly is at the highest position, the other end of each of the support rods 25 still needs to be located in the mounting groove 281. An end of each of the support bases 28 away from the mounting plate assembly 31 may be in contact with the ground to support the entire installation fixture 2.

Therefore, through the support of the support assembly, during the mounting of a motor plate, it is no longer necessary to manually hold the electrode plate 12. It only needs to place the electrode plate 12 on the support disc 21, thereby freeing both hands and saving labor. Meanwhile, the operator can only operate the drive rod assembly 26 to complete the alignment of the electrode plate 12 and the fixing disc 11, which further saves manpower and improves the mounting efficiency. In addition, the deviation of the lip seal rings due to the position deviation and the damage of the electrode plate 12 caused by manual mounting are prevented.

Figure 8:
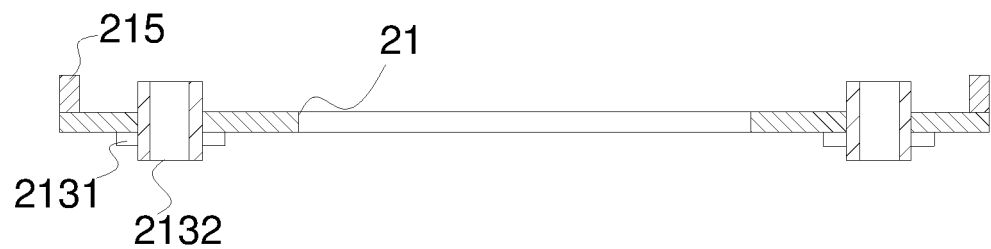
FIG. 8 is a sectional view illustrating a structure taken along lines a-a and b-b in FIG. 7 according to an exemplary embodiment of the present disclosure.

In an embodiment of the present disclosure, as shown in FIG. 8, the support disc 21 may further include snap ring guiders 213. The snap ring guiders 213 each may be provided with a first blocking portion 2131 and a first guiding portion 2132. The first blocking portion 2131 may be located at a periphery of the first guiding portion 2132 and may be connected to the first guiding portion 2132. The first blocking portion 2131 may be in contact with a side of the support disc 21 close to the mounting plate assembly 31. It is understandable that the first blocking portion 2131 is able to block the snap ring guider 213 from moving in a direction away from the mounting plate assembly 31. The first blocking portion 2131 may be composed of two blocking blocks or a blocking ring. The present disclosure does not limit the form of the first blocking portion 2131, as long as it can block the snap ring guider 213 from moving in the direction away from the mounting plate assembly 31, which falls within the protection scope of the present disclosure.

One end of the first guiding portion 2132 is able to pass through one of the positioning holes 211. The first guiding portion 2132 may be interference-fit with the positioning hole 211, but is not limited thereto. The first guiding portion 2132 and the positioning hole 211 may also be matched in other manners, depending on actual conditions.

Further, the first guiding portion 2132 may be provided with a through hole, and the guide shaft 22 is able to pass through the through hole. It is understandable that an extending direction of the through hole is the same as a moving direction of the guide shaft 22. In order to prevent the guide shaft 22 from damaging the support disc 21 when passing through the through hole, the length of the first guiding portion 2132 may be set to a value greater than the thickness of the support disc 21, such that an end of the first guiding portion 2132 away from the mounting plate assembly 31 is higher than the side of the support disc 21 away from the mounting plate assembly 31.

Further, when the end of the first guiding portion 2132 away from the mounting plate assembly 31 is higher than the side of the support disc 21 away from the mounting plate assembly 31, the first guiding portion 2132 is engaged with the positioning screw hole 121 on the electrode plate 12, such that the positioning screw hole 121 on the electrode plate 12 is more conveniently aligned with the positioning hole 211. This can also prevent the electrode plate 12 from deviating during movement after the positioning screw holes 121 of the electrode plate 12 are aligned with the positioning holes 211 on the support disc. However, it is not limited to this. The end of the first guiding portion 2132 away from the mounting plate assembly 31 may also be flush with the side of the support disc 21 away from the mounting plate assembly 31, or it may be lower than the side of the support disc 21 away from the mounting plate assembly 31, which falls within the protection scope of the present disclosure. In addition, the number of the snap ring guiders 213 may be the same as that of the positioning holes 211. That is, there is a snap ring guider 213 in each of the positioning holes 211.

Figure 9:
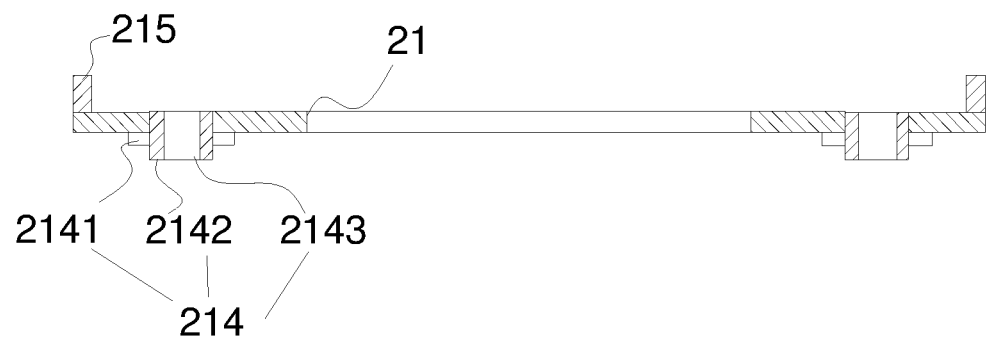
FIG. 9 is a sectional view illustrating a structure taken along lines c-c and d-d in FIG. 7 according to an exemplary embodiment of the present disclosure.
Figure 10:
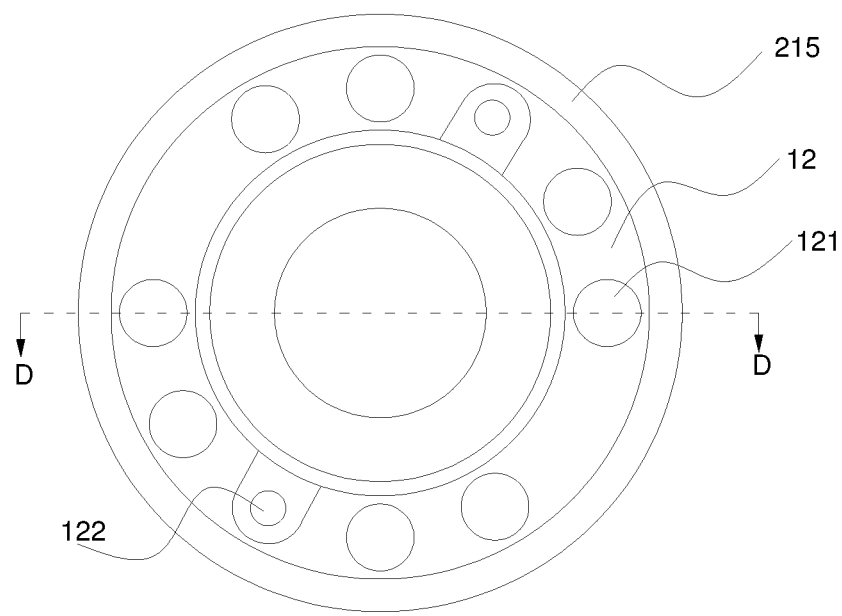
FIG. 10 is a view illustrating a structure of the electrode plate, a support assembly and a fixing disc that are overlapped on the top according to an exemplary embodiment of the present disclosure.

In an embodiment of the present disclosure, as shown in FIG. 9, the support disc 21 may further include drive guiders 214. The drive guiders 214 each may be provided with a second blocking portion 2141 and a second guiding portion 2142. The second blocking portion 2141 may be located at a periphery of the second guiding portion 2142 and may be connected to the second guiding portion 2142. The second blocking portion 2141 may be in contact with the side of the support disc 21 close to the mounting plate assembly 31. It is understandable that the second blocking portion 2141 is able to block the drive guider 214 from moving in a direction away from the mounting plate assembly 31. The second blocking portion 2141 may be composed of two blocking blocks or a blocking ring. The present disclosure does not limit the form of the second blocking portion 2141, as long as it can block the drive guider 214 from moving in the direction away from the mounting plate assembly 31, which falls within the protection scope of the present disclosure.

The second guiding portion 2142 may be provided with a guiding groove 2143. The guiding groove 2143 is provided with an opening on a side close to the mounting plate assembly 31. An end of the second guiding portion 2142 away from the opening may pass through the mounting hole 212 and may be flush with the side of the support disc 21 away from the mounting plate assembly 31. The second guiding portion 2142 may be interference-fit with the mounting hole 212, but is not limited thereto. The present disclosure does not limit the matching manner between the second guiding portion 2142 and the mounting hole 212, which falls within the protection scope of the present disclosure. One end of the support rod 25 is connected to the guiding groove 2143 to realize the connection to the mounting hole 212. One end of the support rod 25 may be fixedly connected to the guiding groove 2143, or may be transitionally matched with the guiding groove 2143, as long as the support rod 25 can drive the support disc 21 to move, which falls within the protection scope of the present disclosure.

In addition, the number of the drive guiders 214 may be the same as that of the mounting holes 212, that is, the number of the drive guiders 214 may also be the same as that of the support rods 25.

Figure 11:
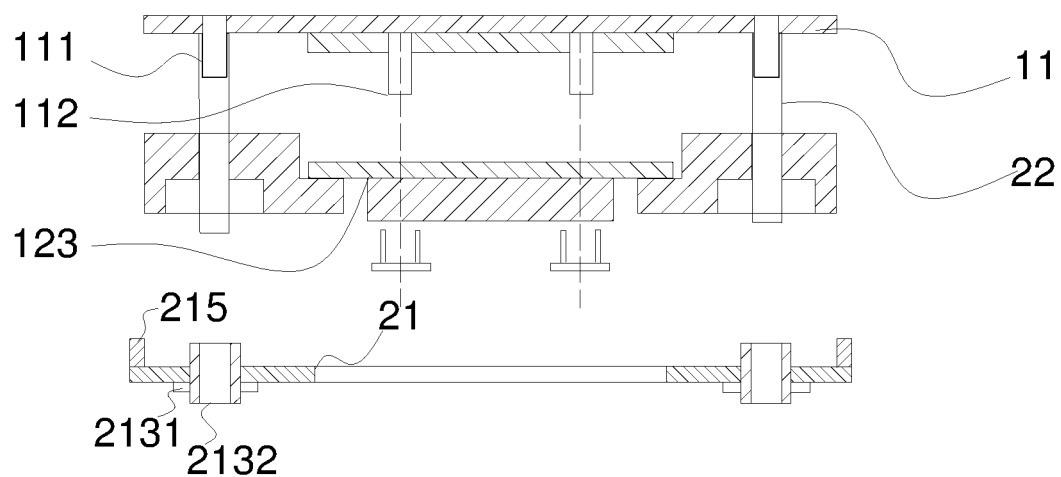
FIG. 11 is an exploded view illustrating a structure taken along line D-D in FIG. 10 according to an exemplary embodiment of the present disclosure.
Figure 12:
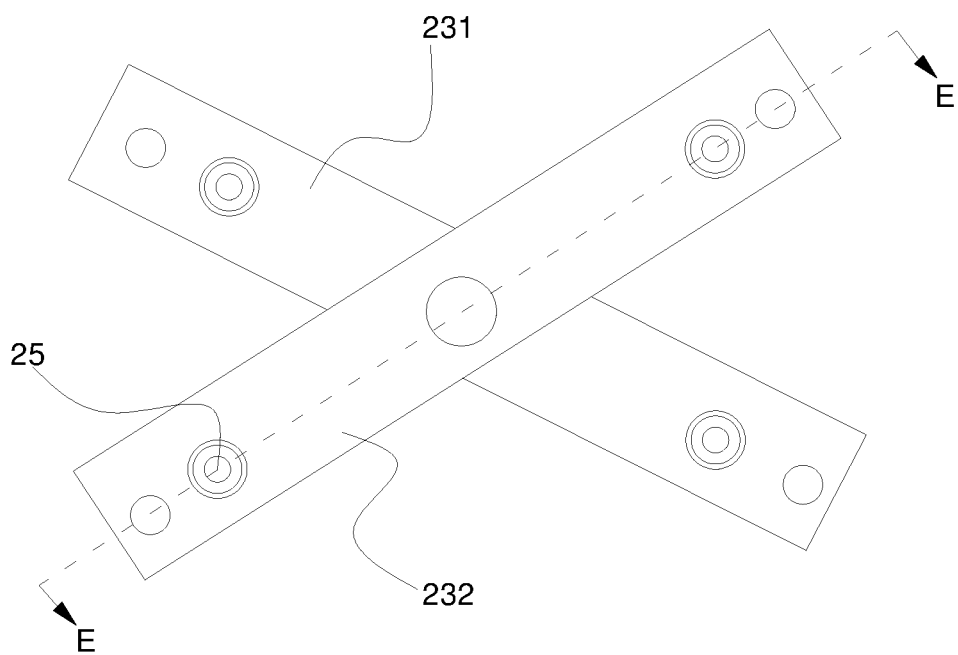
FIG. 12 is a top view illustrating a drive assembly according to an exemplary embodiment of the present disclosure.

In an embodiment of the present disclosure, as shown in FIG. 11, the alignment assembly may further include an engaging ring 215. The engaging ring 215 may be provided on the side of the support disc 21 away from the mounting plate assembly 31 and located at an edge of the support disc. The height of the engaging ring 215 may be equal to that of the clamping ring 124 of the electrode plate 12, so as to engage the electrode plate 12 and prevent the position of the electrode plate 12 from deviating during movement.

Figure 7:
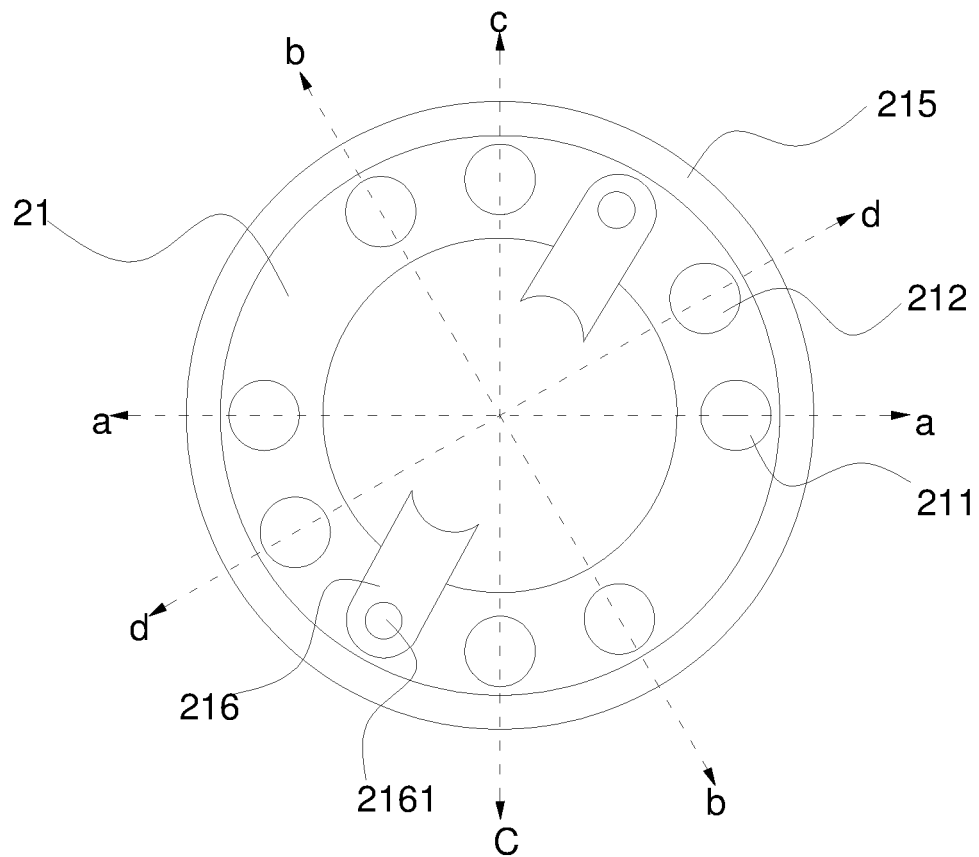
FIG. 7 is a view illustrating a structure of a support disc according to another exemplary embodiment of the present disclosure.

Further, as shown in FIG. 7, the alignment assembly may further include at least one engaging plate 216, and the engaging plate 216 may be provided with a connecting portion and an engaging portion. The connecting portion may be located on the side of the support disc 21 away from the mounting plate assembly 31 and may be connected to the support disc 21. The connecting portion may be provided with a connecting hole 2161, and orthographic projection of a center of the connecting hole 2161 and orthographic projection of a center of the fixing hole 217 may coincide with each other.

The engaging portion may be located on a side of the connecting portion close to a center of the support disc 21 and may be connected to the connecting portion to engage the electrode 123. Further, a side of the engaging portion close to the center of the support disc 21 may be an arc, so as to engage the electrode 123 through two corners of an arc-shaped edge. However, it is not limited to this. The arc may have the same radian as the electrode 123, so as to engage the electrode 123 better by the arc-shaped engaging portion.

Figure 13:
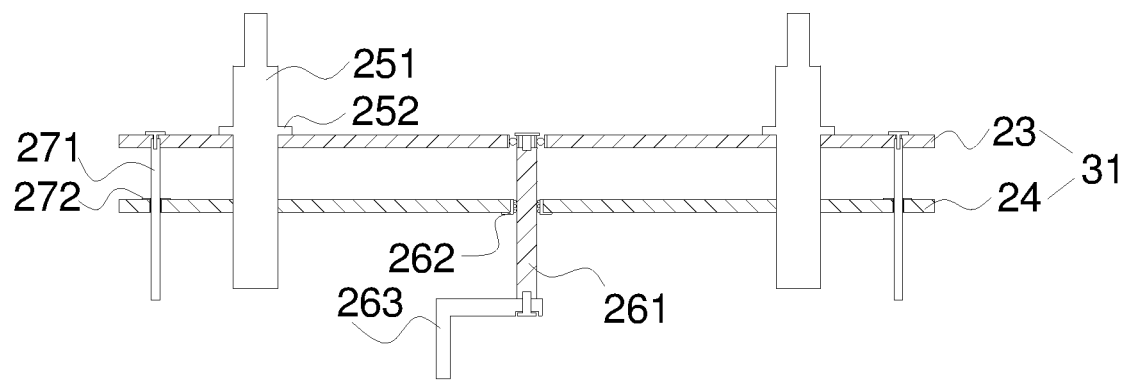
FIG. 13 is a sectional view illustrating a structure taken along line E-E in FIG. 12 according to an exemplary embodiment of the present disclosure.
Figure 16:
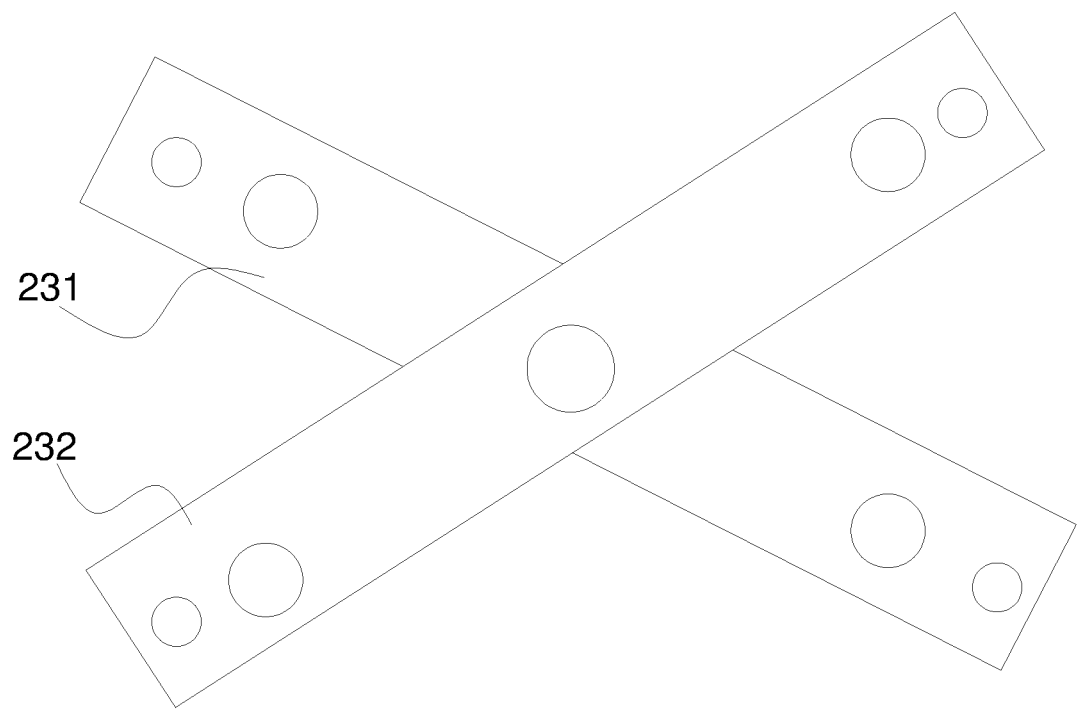
FIG. 16 is a view illustrating a structure of a first mounting plate member according to an exemplary embodiment of the present disclosure.
Figure 17:
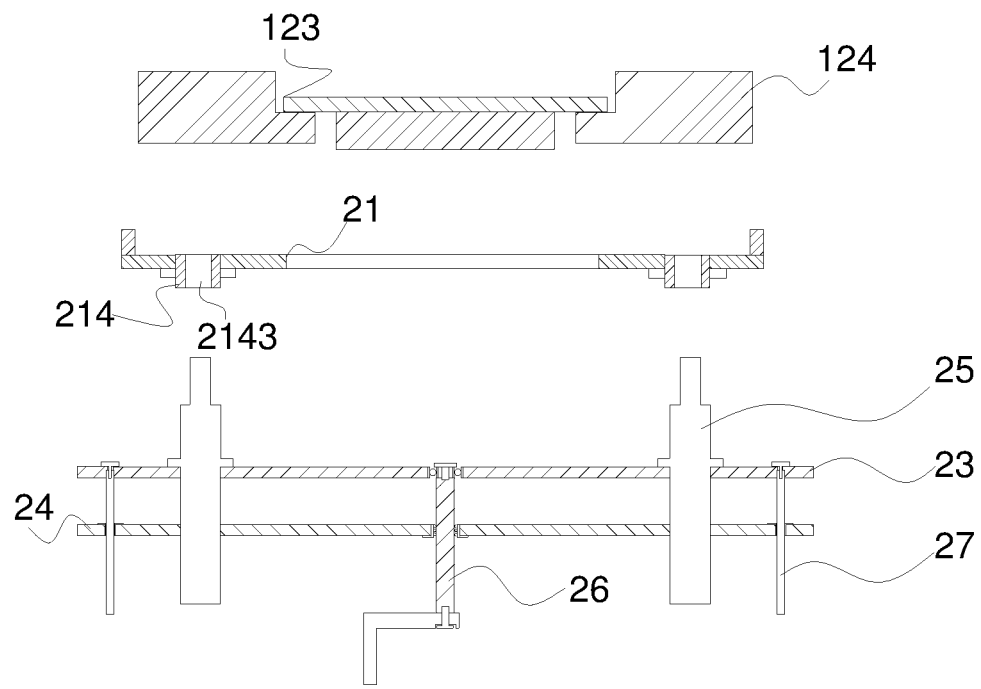
FIG. 17 is a view illustrating a structure of an alignment assembly and a drive assembly that are connected according to an exemplary embodiment of the present disclosure.

In an embodiment of the present disclosure, as shown in FIGS. 13 and 16, the mounting plate assembly 31 may include a first mounting plate member 23 and a second mounting plate member 24. The first mounting plate member 23 may be located on a side of the drive assembly close to the support disc 21, and the second mounting plate member 24 may be located on a side of the drive assembly away from the support disc 21. The drive rod assembly 26 may pass through the second mounting plate member 24 and may be fixedly connected to the first mounting plate member 23. The support rods 25 may pass through the second mounting plate member 24 and may be connected to the first mounting plate member 23.

Further, the first mounting plate member 23 may be the same as the second mounting plate member 24, and orthographic projection of the first mounting plate member 23 and orthographic projection of the second mounting plate member 24 may coincide with each other.

In an embodiment of the present disclosure, as shown in FIG. 13, each of the support rods 25 may be provided with a rod portion 251 and a third blocking portion 252. One end of the rod portion 251 is able to pass through the first mounting plate member 23 and the second mounting plate member 24 and is connected to the guiding groove 2143. It should be noted that the diameter of the end of the support rod 25 connected to the guiding groove 2143 may be less than or equal to the inner diameter of the guiding groove 2143.

Further, in order to ensure a higher strength and a greater supporting force of the support rod 25, the diameter of other part of the support rod 25 may be greater than that of the end of the support rod 25 connected to the guiding groove 2143. The present disclosure does not limit the specific value of the diameter, and the diameter may be set according to actual needs.

The third blocking portion 252 may be located at a periphery of the rod portion 251 and may be connected to the rod portion 251, and the third blocking portion 252 may be in contact with a side of the first mounting plate member 23 close to the support disc 21. It is understandable that the third blocking portion 252 is able to block the support rod 25 from moving in a direction away from the support disc 21. The third blocking portion 252 may be composed of two blocking blocks or a blocking ring. The present disclosure does not limit the form of the third blocking portion 252, as long as it can block the support rod 25 from moving in the direction away from the support disc 21, which falls within the protection scope of the present disclosure.

Figure 14:
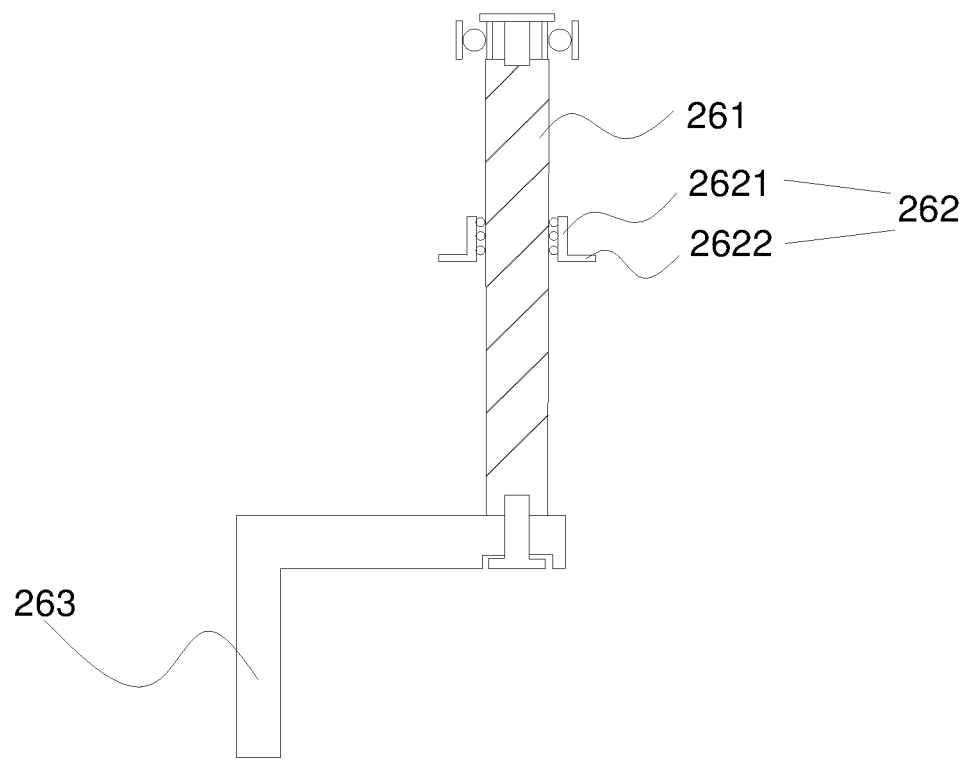
FIG. 14 is a view illustrating a structure of a drive rod assembly according to an exemplary embodiment of the present disclosure.

In an embodiment of the present disclosure, as shown in FIG. 14, the drive rod assembly 26 may be provided with a drive rod 261 and a meshing device 262. An outer peripheral surface of the drive rod 261 may be provided with a first screw-thread, and one end of the drive rod 261 may be connected to the first mounting plate member 23. For example, one end of the drive rod 261 may be connected to the first mounting plate member 23 by a screw, but it is not limited to this. It may also be connected in other manners, which falls within the protection scope of the present disclosure. In addition, the present disclosure does not limit the specific size of the first screw-thread, which may be set according to actual needs.

The meshing device 262 may be provided with a meshing portion 2621. The meshing portion 2621 may pass through the second mounting plate member 24, and an inner surface of the meshing portion 2621 may be provided with a second screw-thread matched with the first screw-thread. The meshing portion 2621 may be meshed with the drive rod 261. When the drive rod 261 rotates, the drive rod 261 is displaced relative to the meshing portion 2621, so as to drive the first mounting plate member 23 to move, thereby driving the support disc 21 to move.

Further, the meshing portion 2621 may be interference-fit with the second mounting plate member 24 to prevent the meshing portion 2621 from falling off during the movement of the drive rod 261.

In order to further prevent the meshing portion 2621 from falling off, the meshing device 262 may also be provided with a fifth blocking portion 2622. The fifth blocking portion 2622 may be located at a periphery of the meshing portion 2621 and may be connected to the meshing portion 2621, and the fifth blocking portion 2622 may be in contact with a side of the second mounting plate member 24 away from the support disc 21. It is understandable that the fifth blocking portion 2622 is able to block the meshing device 262 from moving in a direction close to the support disc 21. The fifth blocking portion 2622 may be composed of two blocking blocks or a blocking ring. The present disclosure does not limit the form of the fifth blocking portion 2622, as long as it can block the meshing device 262 from moving in the direction close to the support disc 21, which falls within the protection scope of the present disclosure.

Further, the drive rod assembly 26 may also be provided with a handle 263, and the handle 263 may be connected to an end of the drive rod 261 that is not connected to the first mounting plate member 23. The handle 263 makes it easier for the operator to turn the drive rod 261.

It should be noted that the drive assembly provided by the present disclosure may also be in other forms, such as hydraulic drive and electric drive, depending on actual needs, which falls within the protection scope of the present disclosure.

In an embodiment of the present disclosure, the drive assembly may further include at least one guide rod assembly 27. The guide rod assembly 27 may pass through the second mounting plate member 24 and may be fixedly connected to the first mounting plate member 23. In this way, it provides guidance for the movement of the first mounting plate member 23, so as to prevent the movement of the first mounting plate member 23 from deviating and make the movement of the first mounting plate member 23 smooth.

Figure 15:
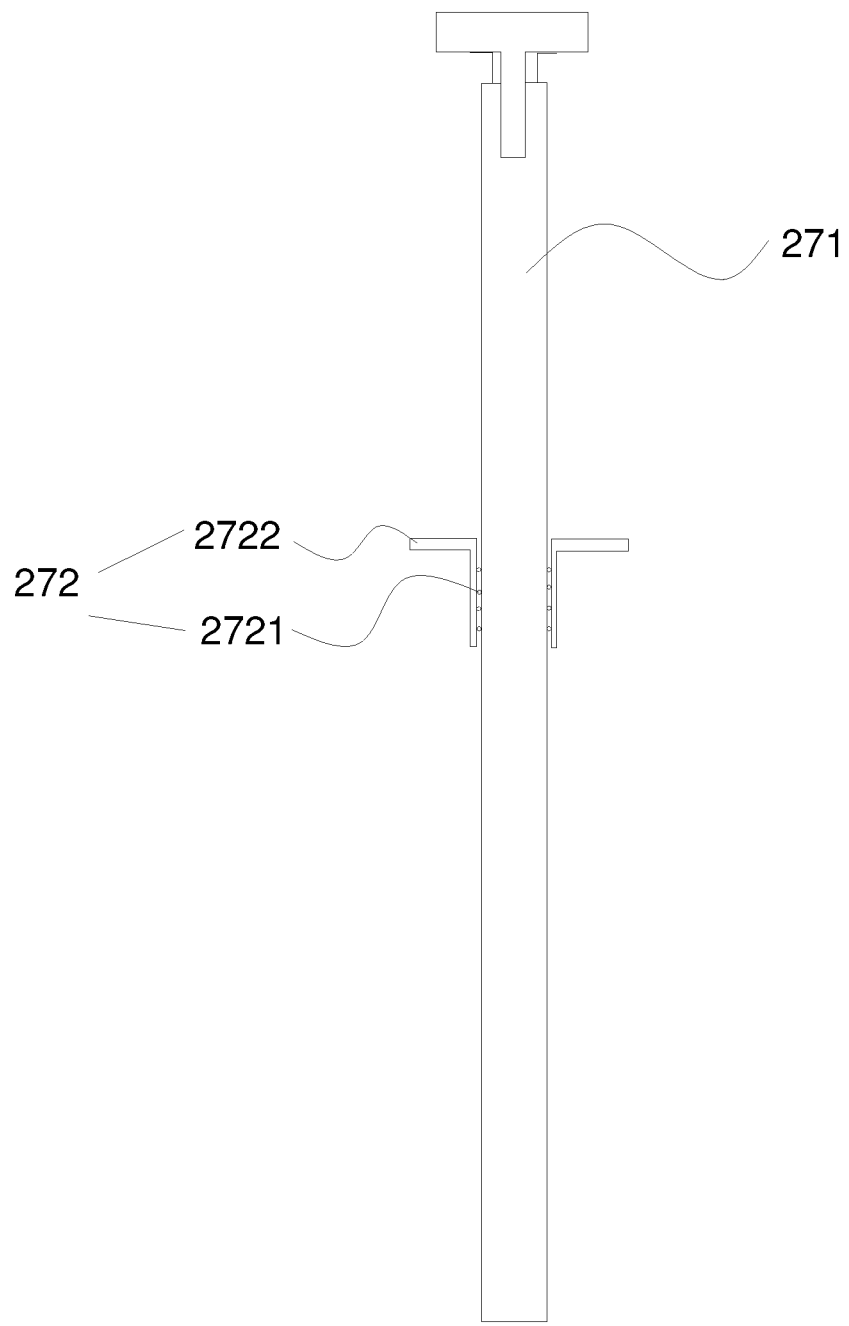
FIG. 15 is a view illustrating a structure of a guide rod assembly according to an exemplary embodiment of the present disclosure.

Further, as shown in FIG. 15, the guide rod assembly 27 may be provided with a guide rod 271 and a ball guider 272. The guide rod 271 may pass through the ball guider 272 and may be fixedly connected to the first mounting plate member 23. That is, an end of the guide rod 271 may be connected to the first mounting plate member 23. For example, the end of the guide rod 271 may be connected to the first mounting plate member 23 by a screw. However, it is not limited to this, and it may also be connected in other manners, which falls within the protection scope of the present disclosure.

The ball guider 272 may be provided with a ball guiding portion 2721, and the ball guiding portion 2721 is able to pass through the second mounting plate member 24. For example, the ball guiding portion 2721 may be a ball bearing, which may be interference-connected to the second mounting plate member 24 to prevent the ball guiding portion 2721 from falling off during the movement of the guide rod 271. The present disclosure does not limit the form and connection manner of the ball guiding portion 2721, and other form and connection manner may also be adopted, which falls within the protection scope of the present disclosure.

In order to further prevent the ball guiding portion from falling off, the ball guiding portion may also be provided with a fourth blocking portion 2722. The fourth blocking portion 2722 may be located at a periphery of the ball guiding portion and may be connected to the ball guiding portion, and the fourth blocking portion 2722 may be in contact with a side of the second mounting plate member 24 close to the support disc 21. It is understandable that the fourth blocking portion 2722 is able to block the ball guider 272 from moving in a direction away from the support disc 21. The fourth blocking portion 2722 may be composed of two blocking blocks or a blocking ring. The present disclosure does not limit the form of the fourth blocking portion 2722, as long as it can block the ball guider 272 from moving in the direction away from the support disc 21, which falls within the protection scope of the present disclosure.

In an embodiment of the present disclosure, as shown in FIG. 18, the support assembly may include at least one reinforcing rod 29, and each reinforcing rod 29 may connect two support bases 28. The reinforcing rod 29 makes the support assembly more stable and significantly improves the support capability of the support assembly.

Further, as shown in FIGS. 19 and 20, the support assembly may also be provided with support feet 30, and the support feet 30 may be provided at ends of the support bases 28 away from the mounting assembly. The support feet 30 can improve the environmental adaptability of the support assembly, adjust the levelness of the support assembly on various grounds, and adjust the height of the support assembly to meet work requirements.

In an embodiment of the present disclosure, the support disc 21 may be made of Teflon, which has a low hardness and can avoid damage to the electrode plate 12 during the contact between the support disc 21 and the electrode plate 12.

In addition, the rod portion 251 of the support rod 25 and the guide rod 271 may also be made of Teflon, which has a low friction coefficient and can make the movement of the support rod 25 and the guide rod 271 smoother and easier.

The present disclosure does not limit the materials of the support disc 21, the rod portion 251 of the support rod 25 and the guide rod 271, and they may also be made of other materials, which falls within the protection scope of the present disclosure.

The installation fixture 2 is described in further detail below with reference to a specific embodiment.

As shown in FIGS. 1 to 20, four positioning screws 111 and two fixing screws 112 may be provided on the fixing disc 11 of the semiconductor equipment, and four positioning screw holes 121 and two fixing screw holes 122 may be provided on the electrode plate 12. The four positioning screws 111 are the same as the two fixing screws 112, and the four positioning screw holes 121 are the same as the two fixing screw holes 122.

The support disc 21 may have four positioning holes 211, two fixing holes 217 and four mounting holes 212. The four positioning holes 211 and the two fixing holes 217 may be evenly arranged on the support disc 21, that is, the angle between two adjacent holes may be 60°. The four mounting holes 212 may be arranged in pairs. The diameter of the four positioning holes 211 is the same as that of the four positioning screw holes 121, and the diameter of the two fixing holes 217 is greater than that of the two fixing screw holes 122. In addition, one snap ring guider 213 may be provided in each of the positioning holes 211, and one drive guider 214 may be provided in each of the mounting holes 212.

Further, the engaging ring 215 may be provided on the support disc 21 and may be provided on an edge of the support disc 21. Meanwhile, the height of the support disc 21 may be greater than or equal to that of the clamping ring 124. An inner wall of the engaging ring 215 may be in contact with an outer wall of the clamping ring 124. There may be two engaging plates 216, which may be respectively provided at the positions of two fixing holes 217, and the diameter of the connecting holes 2161 may be greater than that of the fixing screws 112.

The drive assembly of the installation fixture 2 may be provided with one first mounting plate member 23, one second mounting plate member 24, four support rods 25, one drive rod assembly 26 and four guide rod assemblies 27. The first mounting plate member 23 may be provided with a first mounting plate 231 and a second mounting plate 232 which cross each other, and the second mounting plate member 24 may be provided with a third mounting plate and a fourth mounting plate which cross each other. Orthographic projection of the first mounting plate 231 and orthographic projection of the second mounting plate 232 coincide with orthographic projection of the third mounting plate and orthographic projection of the fourth mounting plate. By arranging the first mounting plate 231 and the second mounting plate 232 to cross each other and the third mounting plate and the fourth mounting plate to cross each other, the supporting force of the mounting plate assembly 31 is improved.

Further, the drive rod 261 may be connected to a crossing of the first mounting plate 231 and the second mounting plate 232 by a screw. The meshing portion 2621 of the meshing device 262 may pass through a crossing of the third mounting plate and the fourth mounting plate, and mesh with the drive rod 261.

The guide rods 271 of the four guide rod assemblies 27 are respectively fixedly connected to two ends of the first mounting plate 231 and two ends of the second mounting plate 232. The ball guiders of the four guide rod assemblies 27 respectively pass through two ends of the third mounting plate and two ends of the fourth mounting plate. The guide rods 271 may pass through the corresponding ball guiders 272.

The four support rods 25 are respectively located between the four guide rod assemblies 27 and the drive rod assembly 26. It is understandable that one end of each of the four support rods 25 respectively passes through the first mounting plate 231 and the second mounting plate 232 and is connected to the guiding groove 2143. The support rods 25 are located between the guide rod assemblies 27 and the drive rod assembly 26, and the other end of each of the four support rods 25 passes through the third mounting plate and the fourth mounting plate.

Further, the support assembly is provided with four support bases 28. Each of the four support bases 28 is provided with a mounting groove 281, and the other end of each of the four support rods 25 is located in the mounting groove 281. That is, the four support bases 28 may be distributed in a quadrilateral pattern. Meanwhile, the support assembly may also be provided with four support feet 30, and the four support feet 30 may be respectively arranged on sides of the support bases 28 away from the support disc 21.

In addition, the support assembly may also be provided with six reinforcing rods 29, and each two support bases 28 are connected by one reinforcing rod 29, thereby significantly improving the supporting capacity of the support bases 28.

To mount the electrode plate 12, an operator only needs to align the positioning screw holes 121 of the electrode plate 12 with the positioning holes 211 of the support disc 21 and then operate the drive assembly to lift the electrode plate 12 to a position to connect the fixing disc 11. In this way, the alignment of the electrode plate 12 and the fixing disc 11 is completed. The operator may first use nuts to connect the electrode plate 12 to the fixing screws 112 through the fixing screw holes 122 and then operate the drive assembly to move the support disc 21 away from the fixed electrode plate 12. After the support disc 21 is far away from the electrode plate 12, the operator may use nuts to connect the electrode plate 12 to the positioning screws 111 of the fixing disc 11 through the four positioning screw holes 121, thereby completing the mounting of the electrode plate 12.

It should be noted that the above only illustrates the installation fixture 2 for the electrode plate 12 of the semiconductor equipment provided by the present disclosure with reference to a specific example. Adjustments may also be made according to actual conditions, which shall still fall within the protection scope of the present disclosure.

Therefore, the installation fixture 2 of the present disclosure requires only one operator to complete the mounting of the electrode plate 12, thereby saving a lot of human resources and improving work efficiency. The installation fixture can also realize precise alignment, thereby increasing the success rate of mounting the electrode plate 12. In addition, the installation fixture 2 can also prevent the electrode plate 12 from being damaged due to a bump that may occur during manual mounting, thereby reducing the mounting cost of the electrode plate 12.

A person skilled in the art may easily think of other implementation solutions of the present disclosure after considering the specification and practicing the content disclosed herein. The present disclosure is intended to cover any variations, purposes or applicable changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the appended claims.

The invention claimed is:

1. An installation fixture for an electrode plate of a semiconductor equipment, wherein the semiconductor equipment is provided with a fixing disc; the fixing disc is provided with at least two positioning screws and at least two fixing screws; the electrode plate is provided with at least two positioning screw holes and at least two fixing screw holes; and the installation fixture for an electrode plate of a semiconductor equipment comprises:

an alignment assembly, comprising a support disc and at least two guide shafts, wherein the support disc is provided with at least two positioning holes, at least two fixing holes and at least two mounting holes; the guide shafts are able to pass through the positioning holes and the positioning screw holes; one end of each of the guide shafts is provided with a positioning groove, and the positioning groove is able to be connected to one of the positioning screws; and the fixing screws are able to pass through the fixing screw holes and the fixing holes;

a drive assembly, comprising a mounting plate assembly, at least two support rods and a drive rod assembly, wherein the support rods are connected to the mounting plate assembly, and one end of each of the support rods is connected to one of the mounting holes; and the drive rod assembly is connected to the mounting plate assembly; and a support assembly, comprising at least two support bases, wherein each of the support bases is provided with a mounting groove; and the other end of each of the support rods is located in the mounting groove.

2. The installation fixture for an electrode plate of a semiconductor equipment according to claim 1, wherein the support disc further comprises:

snap ring guiders, wherein each of the snap ring guiders is provided with a first blocking portion and a first guiding portion; the first blocking portion is located at a periphery of the first guiding portion and is connected to the first guiding portion; and the first blocking portion is in contact with a side of the support disc close to the mounting plate assembly; and one end of the first guiding portion passes through one of the positioning holes, and the first guiding portion is provided with a through hole; and one of the guide shafts is able to pass through the through hole.

3. The installation fixture for an electrode plate of a semiconductor equipment according to claim 1, wherein the support disc further comprises:

drive guiders, wherein each of the drive guiders is provided with a second blocking portion and a second guiding portion; the second blocking portion is located at a periphery of the second guiding portion and is connected to the second guiding portion; and the second blocking portion is in contact with a side of the support disc close to the mounting plate assembly; and the second guiding portion is provided with a guiding groove; the guiding groove is provided with an opening on a side close to the mounting plate assembly; and an end of the second guiding portion away from the opening passes through one of the mounting holes and is flush with a side of the support disc away from the mounting plate assembly.

4. The installation fixture for an electrode plate of a semiconductor equipment according to claim 3, wherein the mounting plate assembly comprises a first mounting plate member and a second mounting plate member;

the first mounting plate member is located on a side of the drive assembly close to the support disc, and the second mounting plate member is located on a side of the drive assembly away from the support disc; and the drive rod assembly passes through the second mounting plate member and is fixedly connected to the first mounting plate member, and the support rods pass through the second mounting plate member and are connected to the first mounting plate member.

5. The installation fixture for an electrode plate of a semiconductor equipment according to claim 4, wherein each of the support rods is provided with a rod portion and a third blocking portion; and one end of the rod portion passes through the first mounting plate member and the second mounting plate member, and is connected to the guiding groove; the third blocking portion is located at a periphery of the rod portion and is connected to the rod portion; and the third blocking portion is in contact with a side of the first mounting plate member close to the support disc.

6. The installation fixture for an electrode plate of a semiconductor equipment according to claim 4, wherein the drive assembly further comprises:

at least one guide rod assembly, wherein the guide rod assembly passes through the second mounting plate member and is fixedly connected to the first mounting plate member.

7. The installation fixture for an electrode plate of a semiconductor equipment according to claim 6, wherein the guide rod assembly is provided with a guide rod and a ball guider;

the guide rod passes through the ball guider and is fixedly connected to the first mounting plate member;
the ball guider is provided with a ball guiding portion and a fourth blocking portion; and the ball guiding portion passes through the second mounting plate member; and
the fourth blocking portion is located at a periphery of the ball guiding portion and is connected to the ball guiding portion; and the fourth blocking portion is in contact with a side of the second mounting plate member close to the support disc.

8. The installation fixture for an electrode plate of a semiconductor equipment according to claim 4, wherein the drive rod assembly is provided with a drive rod and a meshing device;

an outer peripheral surface of the drive rod is provided with a first screw-thread, and one end of the drive rod is connected to the first mounting plate member;
the meshing device is provided with a meshing portion and a fifth blocking portion; the meshing portion passes through the second mounting plate member, and an inner surface of the meshing portion is provided with a second screw-thread matched with the first screw-thread; and the meshing portion is meshed with the drive rod; and
the fifth blocking portion is located at a periphery of the meshing portion and is connected to the meshing portion, and the fifth blocking portion is in contact with a side of the second mounting plate member away from the support disc.

9. The installation fixture for an electrode plate of a semiconductor equipment according to claim 1, wherein the support assembly further comprises:

at least one reinforcing rod, wherein each reinforcing rod connects two support bases.

10. The installation fixture for an electrode plate of a semiconductor equipment according to claim 1, wherein the electrode plate comprises an electrode and a clamping ring; the electrode is mounted on the clamping ring; and the alignment assembly further comprises:

at least one engaging plate, wherein the engaging plate is provided with a connecting portion and an engaging portion;
the connecting portion is located on a side of the support disc away from the mounting plate assembly and is connected to the support disc; the connecting portion is provided with a connecting hole; and orthographic projection of the connecting hole and orthographic projection of the fixing hole coincide with each other; and the engaging portion is located on a side of the connecting portion close to a center of the support disc, and is connected to the connecting portion to engage the electrode.

* * * * *